Figure 1A:
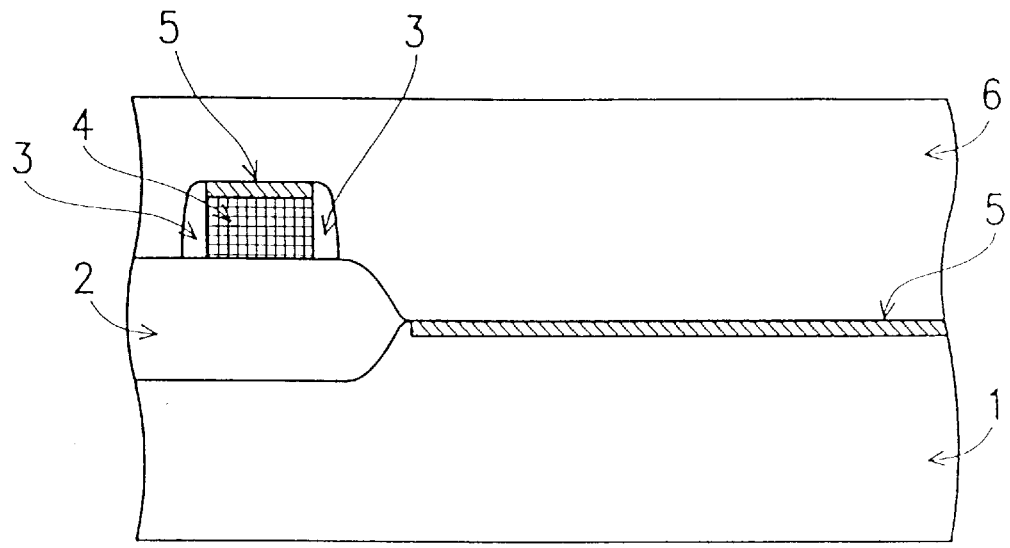

United States Patent [19]
Lin et al.

[11] Patent Number: 5,908,314
[45] Date of Patent: Jun. 1, 1999

[54] TWO-STEP METAL SALICIDE SEMICONDUCTOR PROCESS

[75] Inventors: Benjamin Szu-Min Lin, Chia-I; Chun-Cho Chen, Taipei, both of Taiwan

[73] Assignee: Winbond Electronics Corp., Hsinchu, Taiwan

[21] Appl. No.: 08/828,428

[22] Filed: Mar. 28, 1997

[30] Foreign Application Priority Data

Feb. 4, 1997 [TW] Taiwan .................................. 86101354

[51] Int. Cl.⁶ .......................... H01L 21/28; H01L 21/335
[52] U.S. Cl. .......................... 438/301; 438/586; 438/655; 438/664; 438/683
[58] Field of Search .................................... 438/233, 301, 438/303, 305, 586, 592, 655, 657, 664, 683; 257/383, 413

[56] References Cited

U.S. PATENT DOCUMENTS

| | | | |
|---|---|---|---|
| 4,587,718 | 5/1986 | Haken et al. | 438/297 |
| 5,027,185 | 6/1991 | Liauh | 257/413 |
| 5,034,348 | 7/1991 | Hartswick et al. | 438/453 |
| 5,268,330 | 12/1993 | Givens et al. | 438/586 |
| 5,387,535 | 2/1995 | Wilmsmeyer | 438/621 |
| 5,468,662 | 11/1995 | Havemann | 438/151 |

OTHER PUBLICATIONS

Wolf, S., Silicon Processing for the VLSI Era, vol. 2, Lattice Press, 1990, pp. 144–150, 247–251, 279–283.

*Primary Examiner*—T. N. Quach
*Attorney, Agent, or Firm*—Ladas & Parry

[57] ABSTRACT

A two-step metal salicide semiconductor process, suitable for a semiconductor substrate on which gates, sources (drains), spacers, and field oxides are formed. A first metal layer is formed on the gates. A first high-temperature process is executed to form a first metal salicide layer on the gates. A second metal layer is formed on the first metal salicide layer, sources (drains), spacers, and field oxides. A second high-temperature process is executed to form a thicker second metal salicide layer on the gates and a third metal salicide layer on the sources (drains). A wet etching is then performed. A dielectric layer is formded over the semiconductor substrate wherein the horizontal line of the dielectric layer is above the second metal salicide layer. Polishing is then performed. Finally, shallow contact windows and deep contact windows are then formed for the gates and sources (drains), respectively.

15 Claims, 6 Drawing Sheets

TWO-STEP METAL SALICIDE SEMICONDUCTOR PROCESS

BACKGROUND OF THE INVENTION

1. Field of the Invention

The invention relates to a semiconductor process, and, more particularly, to a two-step metal salicide semiconductor process by which a thicker metal salicide layer is formed on gates to prevent an unacceptable increased gate contact resistance which results from over etching during the etching of shallow contact windows on gates and causes low device efficiencies.

2. Description of the Related Art

Generally, different material layers are formed on a base substrate by depositing and etching in a semiconductor process. As a result, the surface of the substrate on which devices have been already formed is rough, i.e., different positions on the surface of the substrate have different heights. Therefore, etching contact windows having different depths at the same time can not be avoided. In a deep sub-micron semiconductor process, wherein the dimensions of contact windows continue to shrink, a Ti self-aligned salicide (Ti salicide) technology is adopted, and a chemical mechanical polishing (CMP) method is employed. This results in an increasing severity of the over etching problem that causes material loss inside shallow contact windows during the etching of shallow contact windows.

Figure 1B:
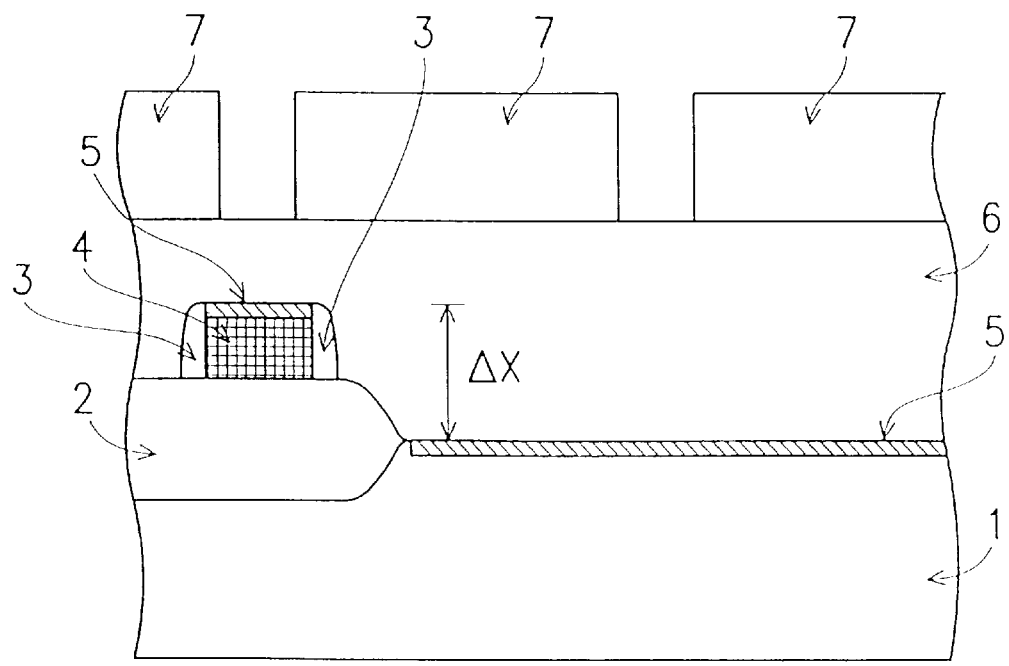
Figure 1C:
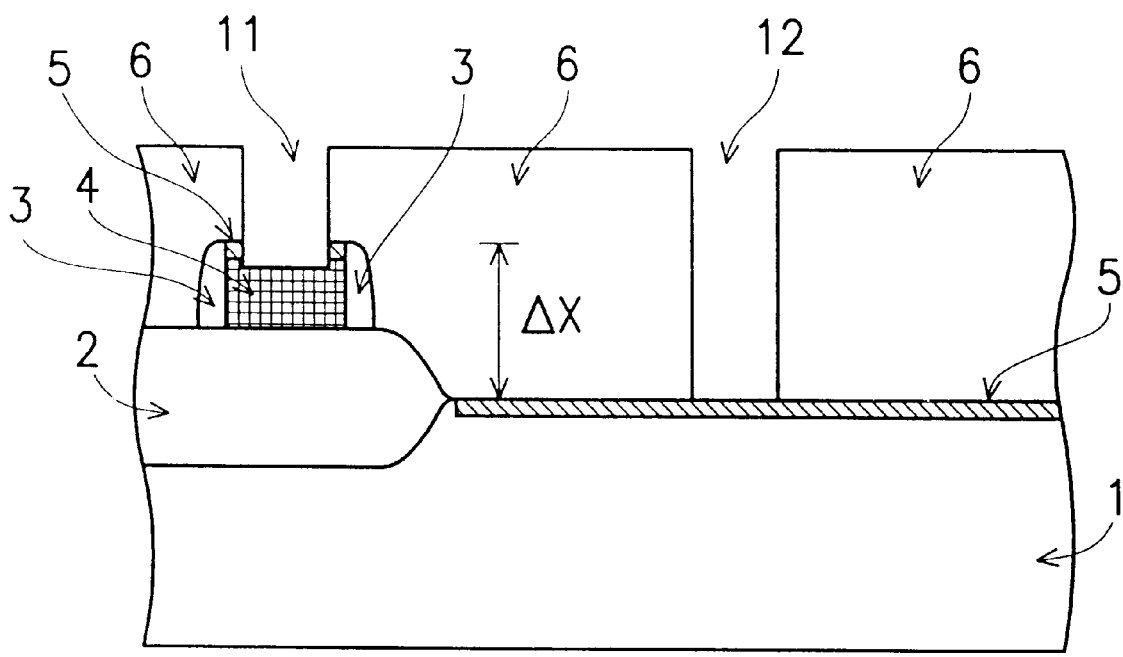

Referring to FIGS. 1A to 1C, a semiconductor wafer contact window process according to the prior art is illustrated. FIG. 1A shows a part of a cross-sectional view of a semiconductor wafer wherein a metal salicide process and a CMP method for planarization have already been completed. Shown are semiconductor substrate 1, field oxide 2, spacers 3, silicon layer 4 (for example, a poly-silicon layer), Ti salicide (TiSi$_2$) layer 5 and interlayer dielectric layer 6.

Referring to FIG. 1B, photoresistor layer 7 is deposited over semiconductor substrate 1 in FIG. 1A and a contact window pattern is defined by a photolithography technology. The result shown in FIG. 1B includes a distance ΔX representing the difference between the depths of two expected contact windows for poly-silicon layer 4 and source (drain) (not shown), respectively.

Referring next to FIG. 1C, shallow contact window 11 and deep contact window 12 are simultaneously formed inside interlayer dielectric layer 6 by anisotropic etching. Since the two expected contact windows have a depth difference ΔX, when Ti salicide layer 5 inside shallow contact window 11 begins to be etched during an etching process, there is still the ΔX thickness in deep contact window 12 left for further etching. Therefore, when deep contact window 12 is etched to the end, Ti salicide layer 5 on poly-silicon layer 4, and even poly-silicon layer 4, are seriously etched resulting in an unacceptable increased gate contact resistance. Typically, Ti salicide layer 5 on poly-silicon layer 4 is thinner and more unstable than that on a single-silicon layer, so the selectivity of interlayer dielectric 6 to Ti salicide layer 5 is not preferable.

SUMMARY OF THE INVENTION

Based on the above, the invention provides a two-step metal salicide semiconductor process, suitable for a semiconductor substrate on which gates, sources (drains), spacers, and field oxides are already formed. A first metal layer is formed on the gates. A first high-temperature process is executed to form a first metal salicide layer on the gates. A second metal layer is formed on the first metal salicide layer, sources (drains), spacers, and field oxides. A second high-temperature process is executed to form a thicker second metal salicide layer on the gates and a third metal salicide layer on the sources (drains). Wet etching is then performed. A dielectric layer is formed over the semiconductor substrate wherein the horizontal line of the dielectric layer is above the second metal salicide layer. Polishing then takes place. Shallow contact windows and deep contact windows are then formed for gates and sources (drains), respectively. Since the above-mentioned second metal salicide layer formed on the gates is thicker, unacceptable increased gate contact resistance resulting from over etching during the etching of shallow contact windows for the gates and the low device efficiencies caused thereby can be prevented.

DETAILED DRAWINGS OF THE INVENTION

The objects, characteristics, and advantages of the present invention will be explained clearly by using a preferred embodiment with pertinent drawings as follows:

FIGS. 1A to 1C are cross-sectional views showing a prior art contact window process; and FIGS. 2A to 2H are cross-sectional views showing a two-step metal salicide semiconductor process for etching contact windows according to an embodiment of the invention.

DETAILED EMBODIMENT OF THE INVENTION

Figure 2A:
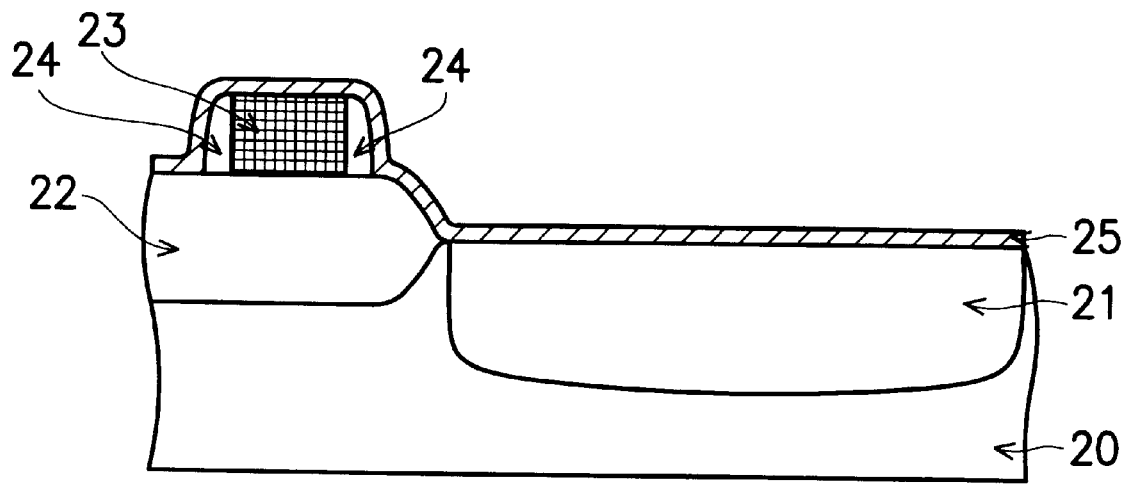

Referring to FIG. 2A, the present invention relates to a two-step metal salicide semiconductor process, suitable for semiconductor substrate 20 on which gate 23, source (drain) 21, spacers 24, and field oxide 22 are already formed. The process includes the following steps:

Step 1

Still referring to FIG. 2A, first Ti metal layer 25 is formed on gate 23, source (drain) 21, spacers 24, and field oxide 22 by chemical vapor deposition (CVD) method.

Step 2

Figure 2B:
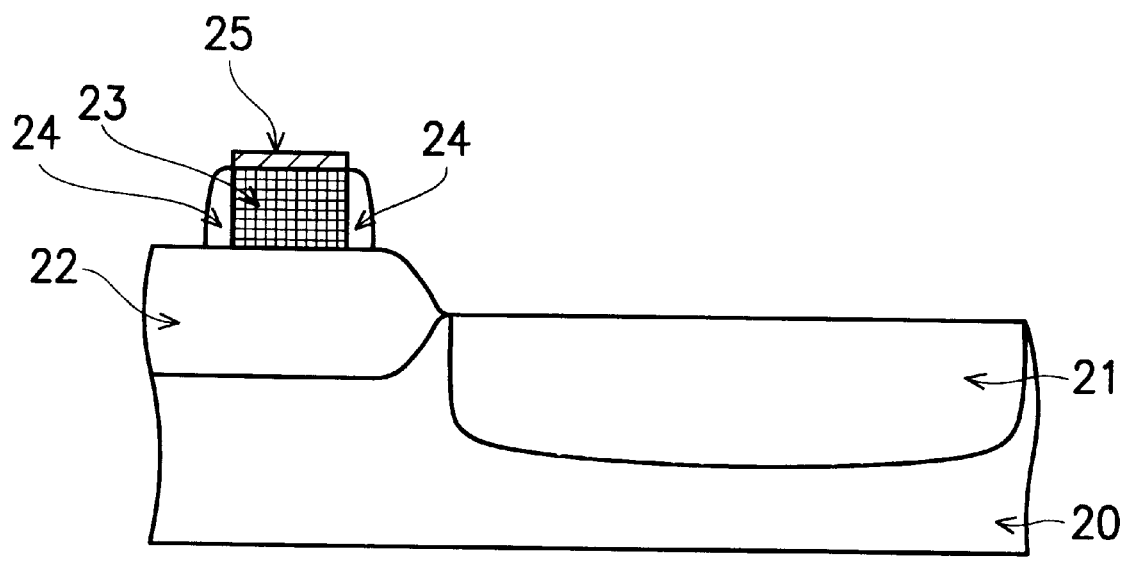

Referring to FIG. 2B, Ti metal layer 25, except that on gate 23, is removed by using a photolithography technology and a plasma etching methodology.

Step 3

Figure 2C:
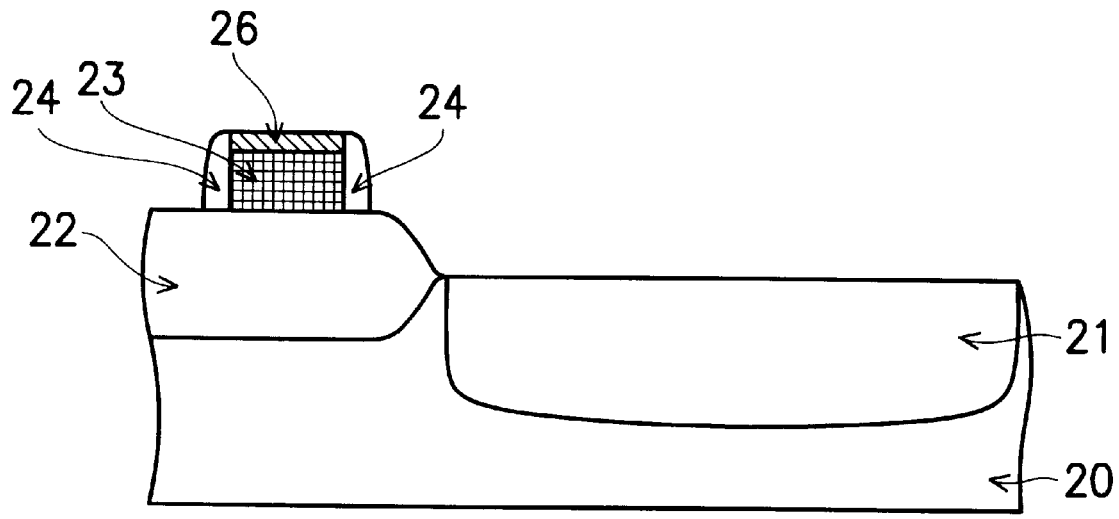

Referring to FIG. 2C, a first high-temperature process, for example, a rapid thermal process (RTP), is executed to form first Ti metal salicide (TiSi$_2$) layer 26 on gate 23.

Step 4

Figure 2D:
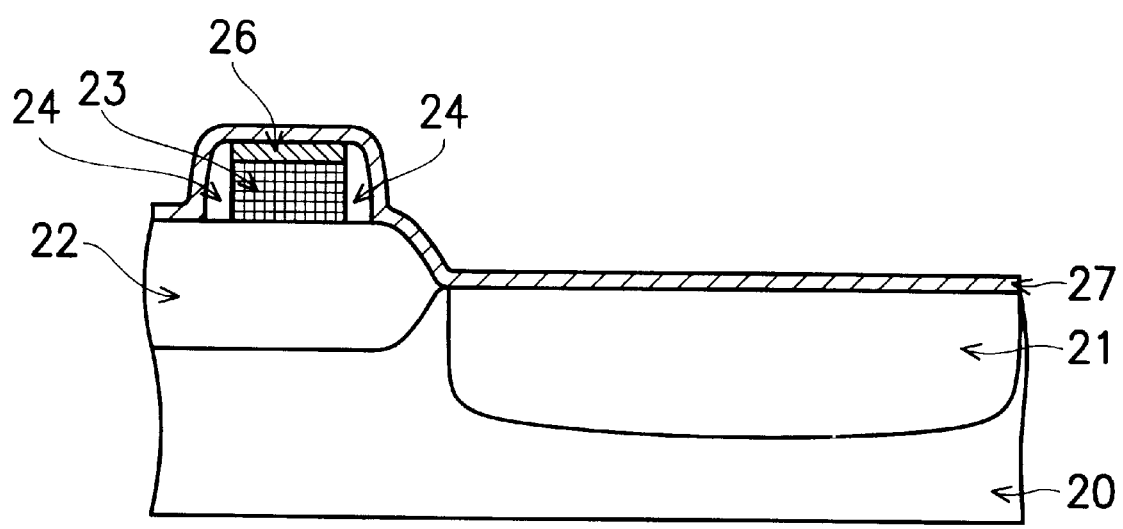

Referring to FIG. 2D, second Ti metal layer 27 is formed over semiconductor substrate 20 by chemical vapor deposition.

Step 5

Figure 2E:
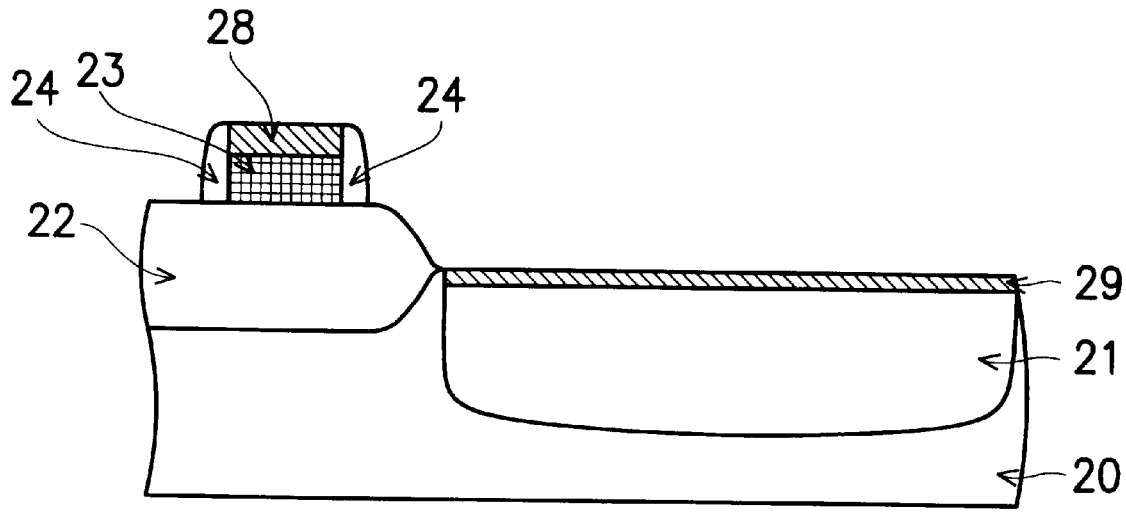

Referring to FIG. 2E, a second high-temperature process, for example, a rapid thermal process (RTP), is executed to form thicker second Ti salicide layer 28 on gate 23 and third Ti salicide layer 29 on source (drain) 21. Then, wet etching is executed to remove the part of the second Ti metal layer 27 which does not join the salicide reaction.

Step 6

Figure 2F:
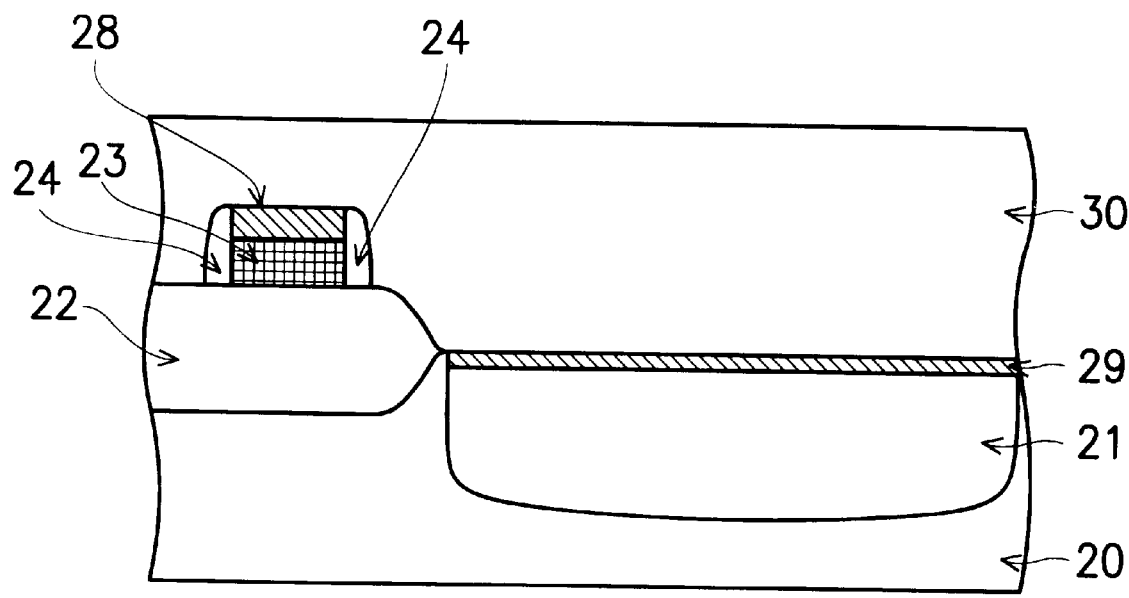

Referring to FIG. 2F, oxide layer 30 is formed over semiconductor substrate 20 by chemical vapor deposition methodology. Then, chemical mechanical polishing (CMP) is executed.

Step 7

Figure 2G:
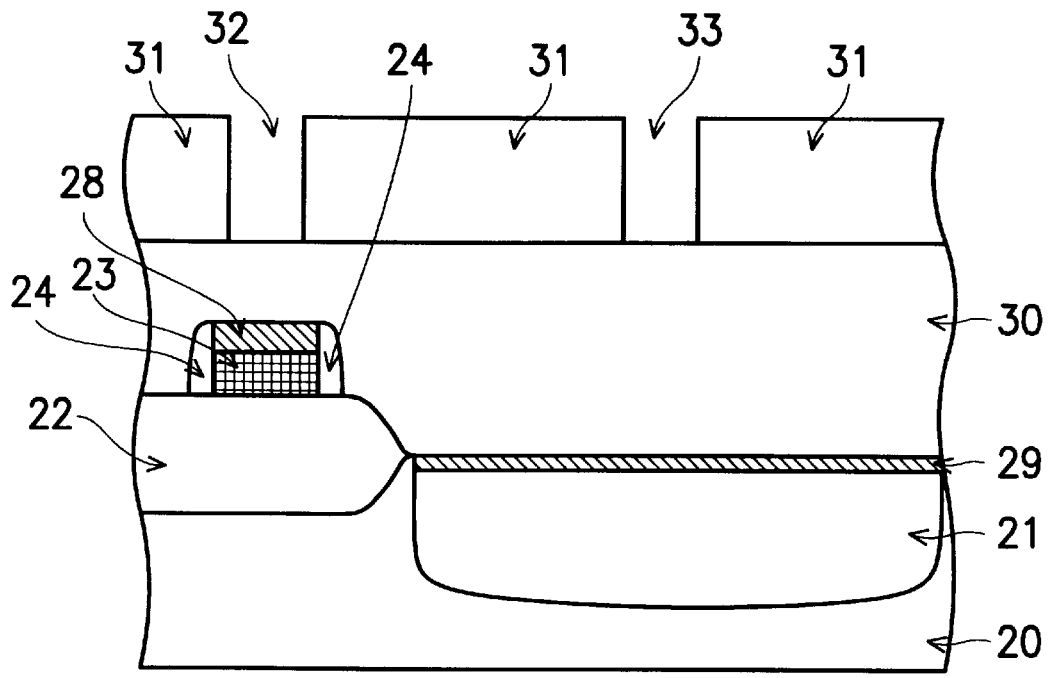

Referring to FIG. 2G, photoresistor layer 31 is formed on oxide layer 30. Then, first trench 32 and second trench 33 are formed by using a photolithography technology.

Step 8

Figure 2H:
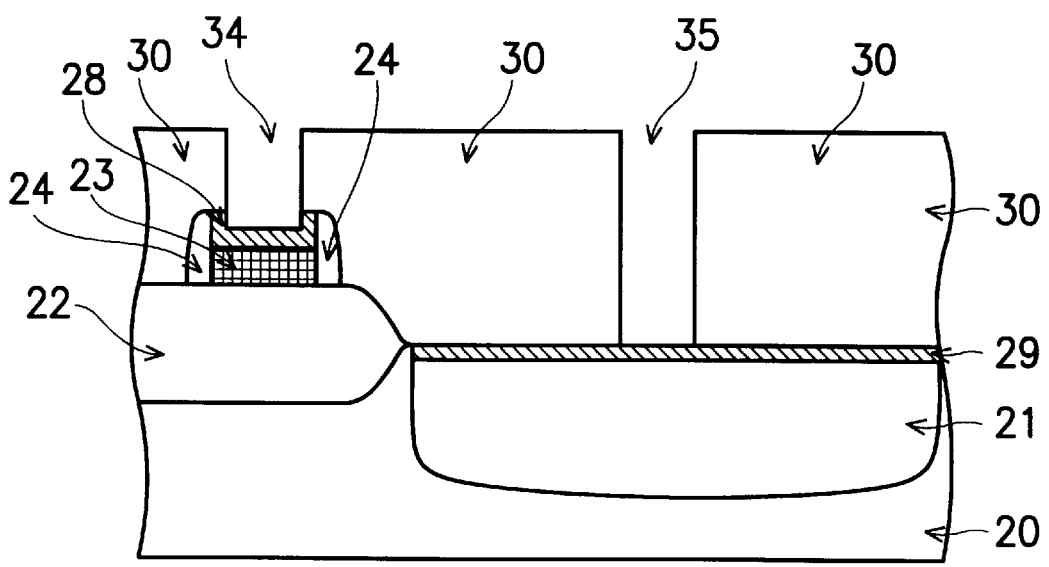

Referring to FIG. 2H, shallow contact window 34 and deep contact window 35 are formed on gate 23 and source (drain) 21, respectively, by anisotropic plasma etching.

Based on the two-step metal salicide semiconductor process according to an embodiment of the invention, thicker second Ti salicide layer (TiSi$_2$) 28 formed can prevent itself, and even gate 23, from over etching resulting in an unacceptable increased gate contact resistance that causes low device efficiencies.

Although the invention has been disclosed in terms of a preferred embodiment, the disclosure is not intended to limit the invention. Those knowledgeable in the art can make modifications within the scope and spirit of the invention which is determined by the claims below.

What is claimed is:

1. A two-step metal salicide process of making a semiconductor device on a semiconductor substrate wherein a plurality of gates, sources/drains, spacers, and field oxides are already formed, comprising:

forming a first metal layer over said semiconductor substrate;

removing a portion of said first metal layer from said sources/drains, said spacers, and said field oxides, so that said first metal layer only remains on said gates;

executing a first high-temperature process to form a first metal salicide layer on said gates;

forming a second metal layer on said first metal salicide layer, sources/drains, spacers, and field oxides;

executing a second high-temperature process to form a second metal salicide layer on said gates and a third metal salicide layer on said sources/drains, wherein said second metal salicide is thicker than said third metal salicide layer; and executing a wet etch to remove a part of said second metal layer which does not join said second silicide reaction.

2. The two-step metal salicide process of claim 1, after executing said wet etching, further comprising:

forming a dielectric layer over said semiconductor substrate wherein the horizontal line of said dielectric layer is above said second metal salicide layer;

executing a polishing; and forming a plurality of shallow contact windows and deep contact windows on said gates and sources/drains, respectively.

3. The two-step metal salicide process of claim 2 wherein said dielectric layer is an oxide layer.

4. The two-step metal salicide process of claim 2 wherein said dielectric layer is formed by chemical vapor deposition.

5. The two-step metal salicide process of claim 2 wherein said polishing is chemical mechanical polishing.

6. The two-step metal salicide process of claim 2 wherein said shallow contact windows and said deep contact windows are formed by photolitography and plasma etching.

7. The two-step metal salicide process of claim 6 wherein said plasma etching is anisotropic etching.

8. The two-step metal salicide process of claim 1 wherein said first high-temperature process is a rapid thermal process.

9. The two-step metal salicide process of claim 1 wherein said second high-temperature process is a rapid thermal process.

10. The two-step metal salicide process of claim 1 wherein said first metal layer is a Ti metal layer.

11. The two-step metal salicide process of claim 1 wherein said first metal layer is formed by chemical vapor deposition, photolithography, and plasma etching.

12. The two-step metal salicide process of claim 1 wherein said second metal layer is a Ti metal layer.

13. The two-step metal salicide process of claim 1 wherein said second metal layer is formed by chemical vapor deposition.

14. The two-step metal salicide process of claim 1 wherein said first metal salicide layer is a Ti metal salicide layer.

15. The two-step metal salicide process of claim 1 wherein said second metal salicide layer and third metal salicide layer are Ti metal salicide layers.

* * * * *